(12) United States Patent
Visser et al.

(10) Patent No.: US 6,741,126 B1
(45) Date of Patent: May 25, 2004

(54) LOW NOISE AMPLIFIER ARRANGEMENT

(75) Inventors: Barend Visser, Potchefstroom (ZA); Ocker Cornelis De Jager, Potchefstroom (ZA)

(73) Assignee: The North West University, Potchefstroom (ZA)

( * ) Notice: Subject to any disclaimer, the term of this patent is extended or adjusted under 35 U.S.C. 154(b) by 0 days.

(21) Appl. No.: 10/088,433

(22) PCT Filed: Sep. 15, 2000

(86) PCT No.: PCT/ZA00/00172

§ 371 (c)(1),
(2), (4) Date: Sep. 26, 2002

(87) PCT Pub. No.: WO01/20778

PCT Pub. Date: Mar. 22, 2001

(30) Foreign Application Priority Data

Sep. 15, 1999 (ZA) .............................. 99/5930

(51) Int. Cl.$^7$ .............................. H03F 3/68; H03F 3/60
(52) U.S. Cl. ..................................... 330/124 R; 330/54
(58) Field of Search ............................ 330/53, 54, 56, 330/57, 124 R, 286, 295

(56) References Cited

U.S. PATENT DOCUMENTS

| | | | | | |
|---|---|---|---|---|---|
| 4,092,616 A | * | 5/1978 | Osterwalder | .................... | 333/6 |
| 4,797,628 A | * | 1/1989 | Gruchalla et al. | ............ | 330/54 |
| 4,973,918 A | * | 11/1990 | Schindler | ................ | 330/286 X |

* cited by examiner

Primary Examiner—Steven J. Mottola
(74) Attorney, Agent, or Firm—McDonnell Boehnen Hulbert & Berghoff

(57) ABSTRACT

An amplifier arrangement (10) comprises an input node (24) and an output node (26). A plurality of amplifiers (20.1) to 20.4) are connected in respective parallel paths (28.1 to 28.4) extending between the input node and the output node. The input node divides an input signal $S_i(t)$ into signal $S_1(t)$ to $S_4(t)$ and feeds the signal parts along respective paths to the output node. The paths have equal propagation delays for the signal parts, to provide at the output node an output signal $S_o(t)$ comprising a coherent summation of the signal parts and an incoherent summation of noise.

9 Claims, 5 Drawing Sheets

LOW NOISE AMPLIFIER ARRANGEMENT

INTRODUCTION AND BACKGROUND

The invention relates to amplifiers and more particularly to low noise amplifiers.

It is well known that in small signal applications, noise generated by or in, and contributed by an amplifier in a circuit for amplifying the small signal could overpower the signal.

OBJECT OF THE INVENTION

It is an object of the present invention to provide an amplifier arrangement and method of amplifying a signal with which the applicant believes the aforementioned problems may at least be alleviated.

SUMMARY OF THE INVENTION

According to the invention there is provided an amplifier arrangement comprising:

an input node;

an output node;

a plurality of amplifiers connected in respective parallel paths extending between the input node and the output node;

the input node dividing an input signal into signal parts and feeding the signal parts along respective paths to the output node; and the paths having equal propagation delays for the signal parts, to provide at the output node an output signal comprising a coherent summation of the signal parts.

The amplifier arrangement may comprise a first transmission medium having one end and an opposite end and a second transmission medium having one end and an opposite end, the input node may be provided towards the one end of the first transmission medium, the output node may be provided towards the opposite end of the second transmission medium and the parallel paths preferably extend between the first transmission medium and the second transmission medium.

A spacing between one of said parallel paths and an adjacent parallel path on the first transmission medium is preferably equal to a spacing between the one path and the adjacent path on the second transmission medium.

Termination means may be provided at the opposite end of the first transmission medium and at the one end of the second transmission means.

The amplifier arrangement may be adapted for amplifying a pulse having a pulse width and the spacing is preferably larger than a distance through which the pulse would travel through the medium in a time equal to the pulse width.

One of the first transmission medium and the second transmission medium may comprise a transmission line.

In some embodiments each of the first transmission medium and the second transmission medium comprises a coaxial cable.

In other embodiments each of the first transmission medium and the second transmission medium comprises a strip line.

In yet another embodiment the first transmission medium may comprise a transmission line and the second transmission medium may comprise a two dimensional conductive layer.

In still another embodiment the second transmission medium may comprise a three-dimensional cavity. The cavity may comprise signal absorbent means.

Also included within the scope of the present invention is a method of amplifying a signal comprising the steps of:

at an input node, dividing the signal into signal parts propagating along respective paths to an output node;

amplifying the signal parts in the paths by amplifying means in the paths;

causing a propagating delay in each of the paths to be the same;

at the output node, coherently summing the amplified signal parts to provide an output signal; and incoherently summing noise added by the amplifiers.

The output signal is preferably caused to propagate in predominantly a first direction towards an output, noise is preferably caused to propagate in another direction as well, and the noise propagating in the other direction is absorbed.

BRIEF DESCRIPTION OF THE ACCOMPANYING DIAGRAMS

The invention will now further be described, by way of example only, with reference to the accompanying diagrams wherein.

DESCRIPTION OF A PREFERRED EMBODIMENT OF THE INVENTION

Figure 1:
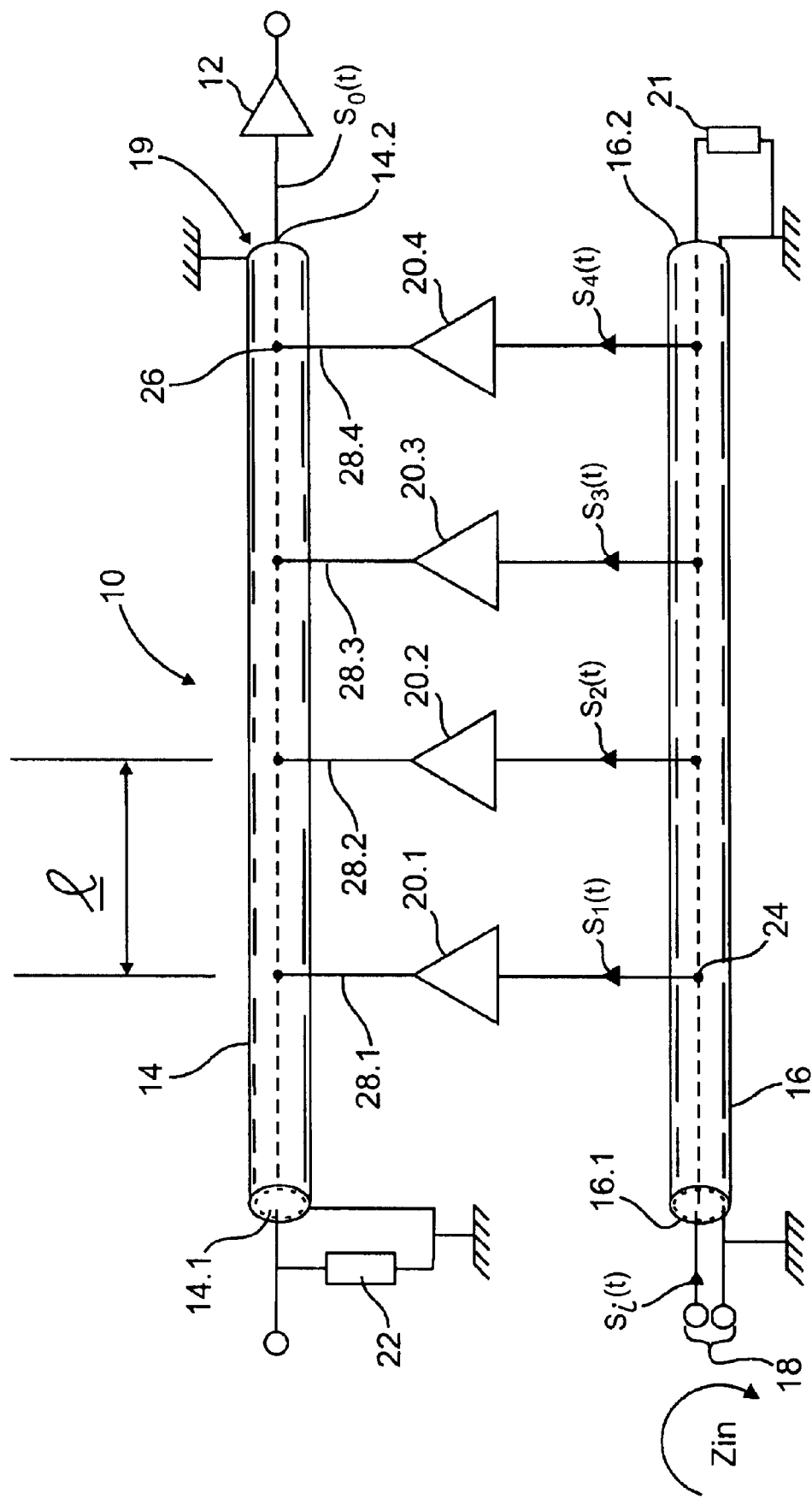
FIG. 1 is a diagrammatic representation of a first embodiment of the amplifier arrangement according to the invention.

In FIG. 1, a first embodiment of the amplifier arrangement according to the invention is generally designated by the reference numeral 10.

The arrangement 10 is connected as a pre-amplifier arrangement to main amplifier 12. The arrangement includes first and second transmission media in the form of first and second co-axial cables 14 and 16. Cable 16 provides at one end 16.1 thereof an input 18. The other or opposite end 16.2 thereof is properly terminated by termination means in the form of a resistor 21. The cable 14 also comprises one end 14.1 and an opposite end 14.2. The opposite end 14.2 of cable 14 constitutes output 19 of the arrangement which output is connected to an input of the main amplifier 12. The one end 14.1 of cable 14 is properly terminated by termination means in the form of a resistor 22.

The arrangement further comprises an input node 24 and an output node 26. A plurality of parallel paths 28.1 to 28.4 are provided between the input node and the output node. The signal propagation delay through each of these paths is the same. In each of paths 28.1 to 28.4 there is connected a respective amplifier stage 20.1 to 20.4. The amplifier stages 20.1 to 20.4 may each include a transistor (not shown) connected in common emitter configuration and the main amplifier 12 may include a transistor (also not shown) connected in common base configuration.

An input signal $S_i(t)$ at the input 18 is divided along line 16 into signal parts $S_1(t)$ propagating along path 28.1 to output node 26, signal part s$_2$(t) propagating along path 28.2 to output node 26, signal part s$_3$(t) propagating along path 28.3 to output node 26 and signal part S$_4$(t) propagating along path 28.4 to output node 26.

Because the propagating delays through the paths are the same the signal parts will at the same time arrive at node 26, where they are coherently summed to constitute an output signal S$_o$(t) The energy in the output signal propagates predominantly from node 26 towards output 19. On the other hand, noise generated by the amplifiers 20.1 to 20.4 are incoherently added or summed along line 14. Furthermore, at least part of the noise propagates away from output 19 towards resistor 22 where it is absorbed. It is believed that the arrangement according to the invention provides improved noise suppression characteristics.

Figure 2:
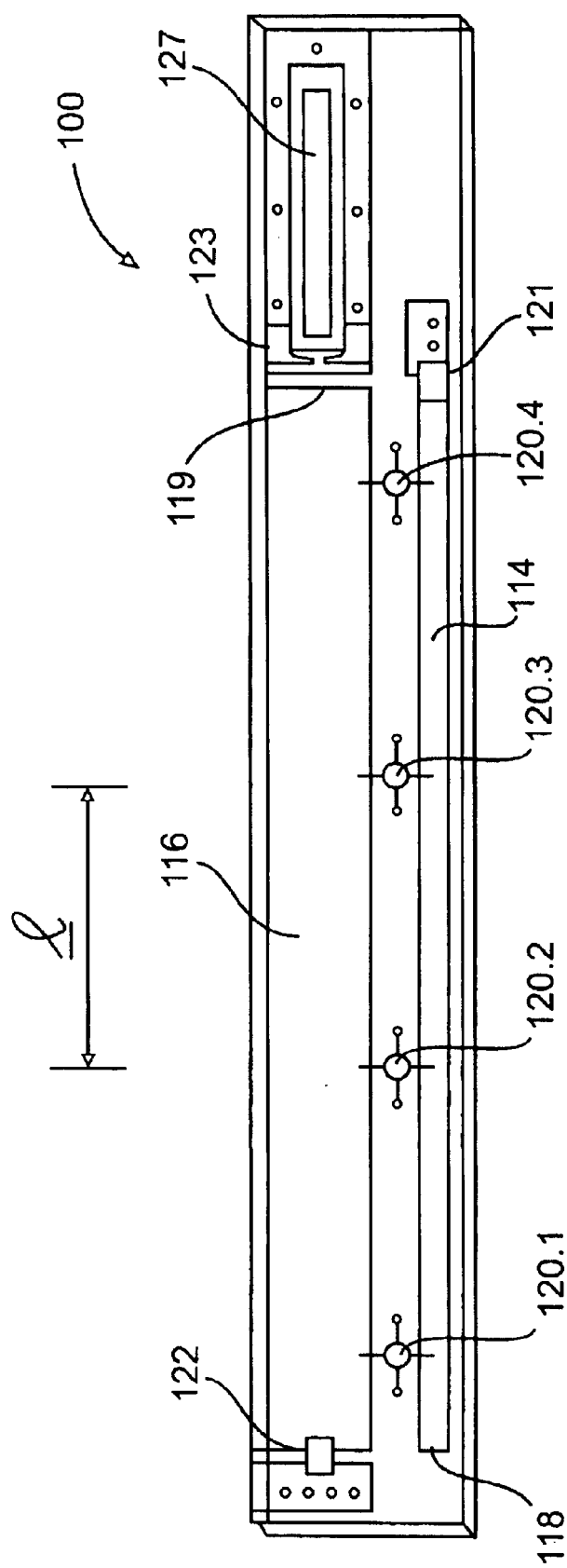
FIG. 2 is a diagrammatic representation of a second embodiment of the arrangement.

In FIG. 2, there is shown a strip line implementation of the arrangement marked 100. The input of the arrangement 100 is provided at 118 at the one end of the first line 114. First strip line 114 is a 50Ω line terminated by a 50Ω resistor 121 at the other end thereof. A second strip line 116, which is a 10Ω line, extends parallel to the first line and is spaced about 5 mm from the first line. The second line 116 is connected at an output 119 to an output amplifier 123. The output amplifier 123 is connected in a conventional way to a 50Ω output strip line 127. The line 116 is terminated at its one end by a resistor 122.

The amplifiers 120.1 to 120.4 comprise common source FET's and are interspaced by a distance 1 equal to 7.5cm. The propagation speed of the signal through the strip lines is c/2 where c is equal to the speed of light. Hence, the spacing 1 corresponds to a full width half maximum (FWHM) value of 0.5 ns for a input pulse S$_i$(t).

Figure 5:
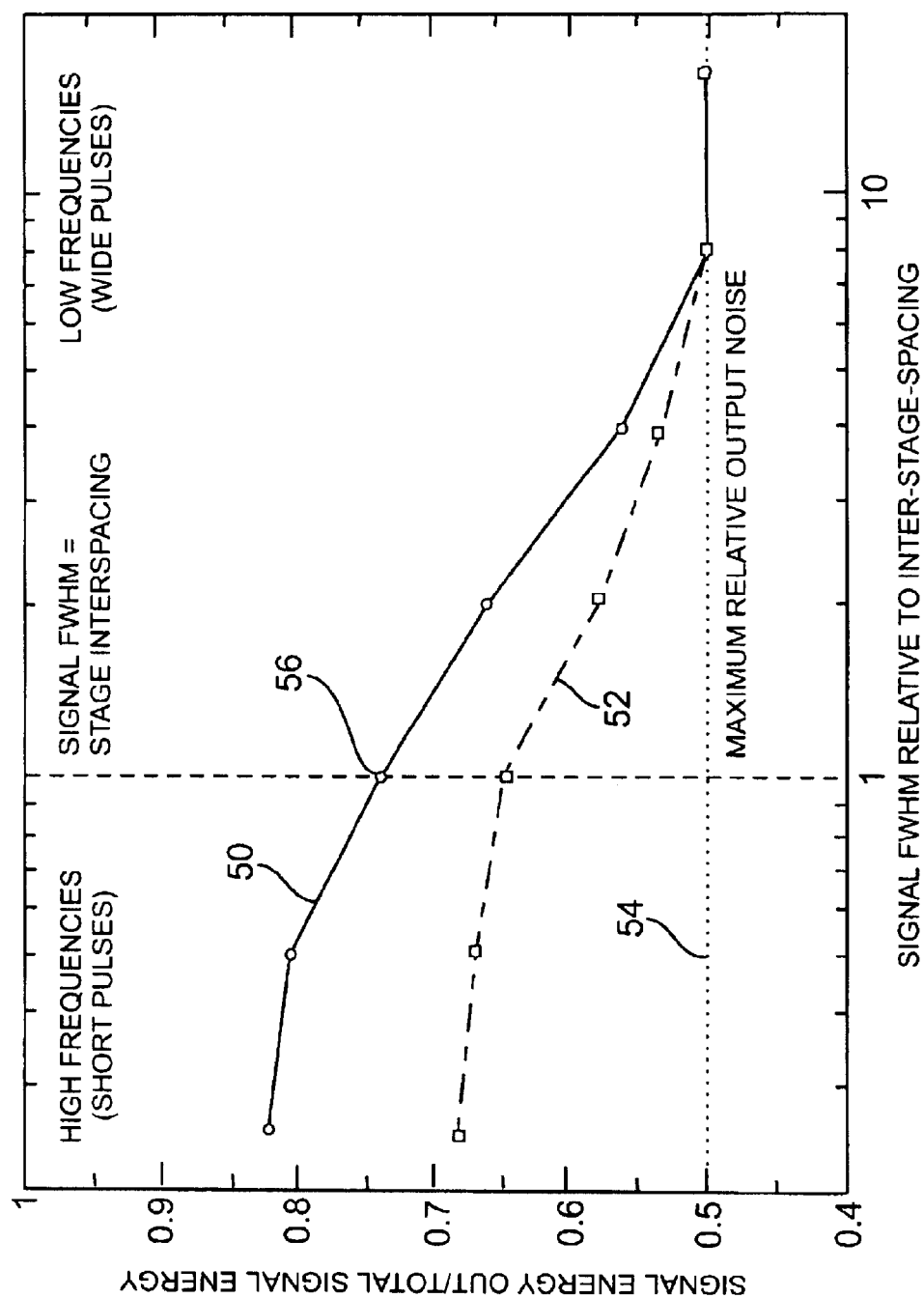
FIG. 5 is a graph of signal response and noise response against spacing between adjacent amplifier stages in the arrangement.

In FIG. 5, there is shown a graph of the output signal S$_o$(t) in the form of relative signal energy marked 50 and relative RMS signal voltage marked 52 against the ratio of full width half maximum (FWHM) of the input pulse and spacing 1 between paths. With the ratio equal to one, that is with the aforementioned spacing of 7.5 cm and a pulse with FWHM= 0.5 ns, about 75% (see numeral 56 on the graph) of the summed signal propagates toward output 119. A graph of output noise is also shown at 54 and it is clear that less than 50% of noise generated propagates toward 119.

It will also be seen from FIG. 5 that signal loses for short pulses, that is pulses substantially shorter than the spacing 1 is lower than for larger pulses.

Figure 3:
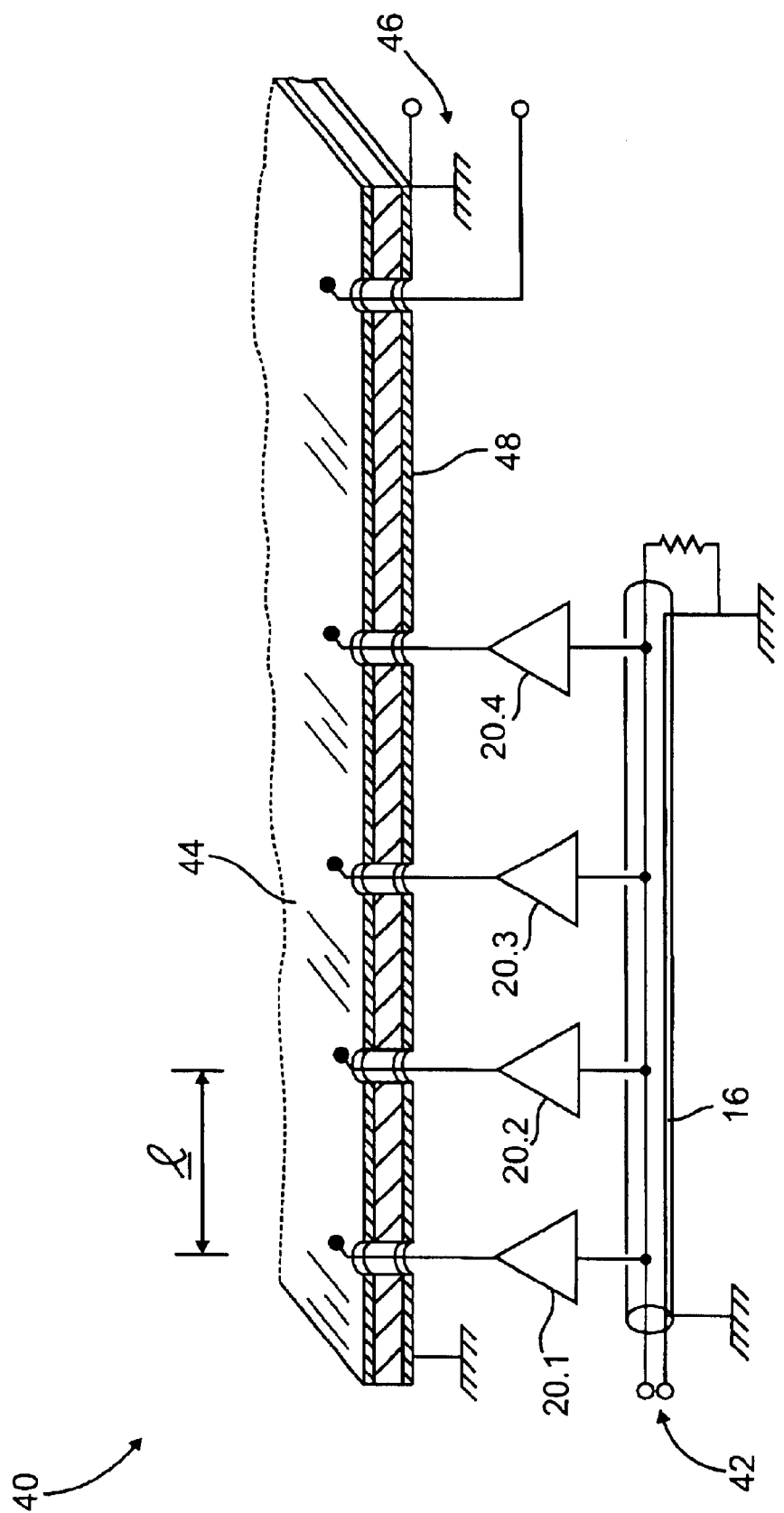
FIG. 3 is a diagrammatic representation of a third embodiment of the arrangement wherein the outputs of amplifier stages are connected to a two-dimensional surface.

In FIG. 3, a further embodiment of the arrangement is shown designated 40. In this embodiment the outputs of the amplifier stages 20.1 to 20.4 are connected to a two-dimensional conductive surface 44. The output of the arrangement 40 is provided at 46 between opposed conductive surfaces 44 and 48. A coherent summation of signal parts of an input signal provided at 42 is available at output 46. Suitable termination elements (not shown) may be applied to the arrangement 40 to dissipate noise. It is believed that a two dimensional arrangement (as shown in FIG. 3) may have even better noise suppression characteristics than a one-dimensional arrangement (as shown in FIG. 1).

Figure 4:
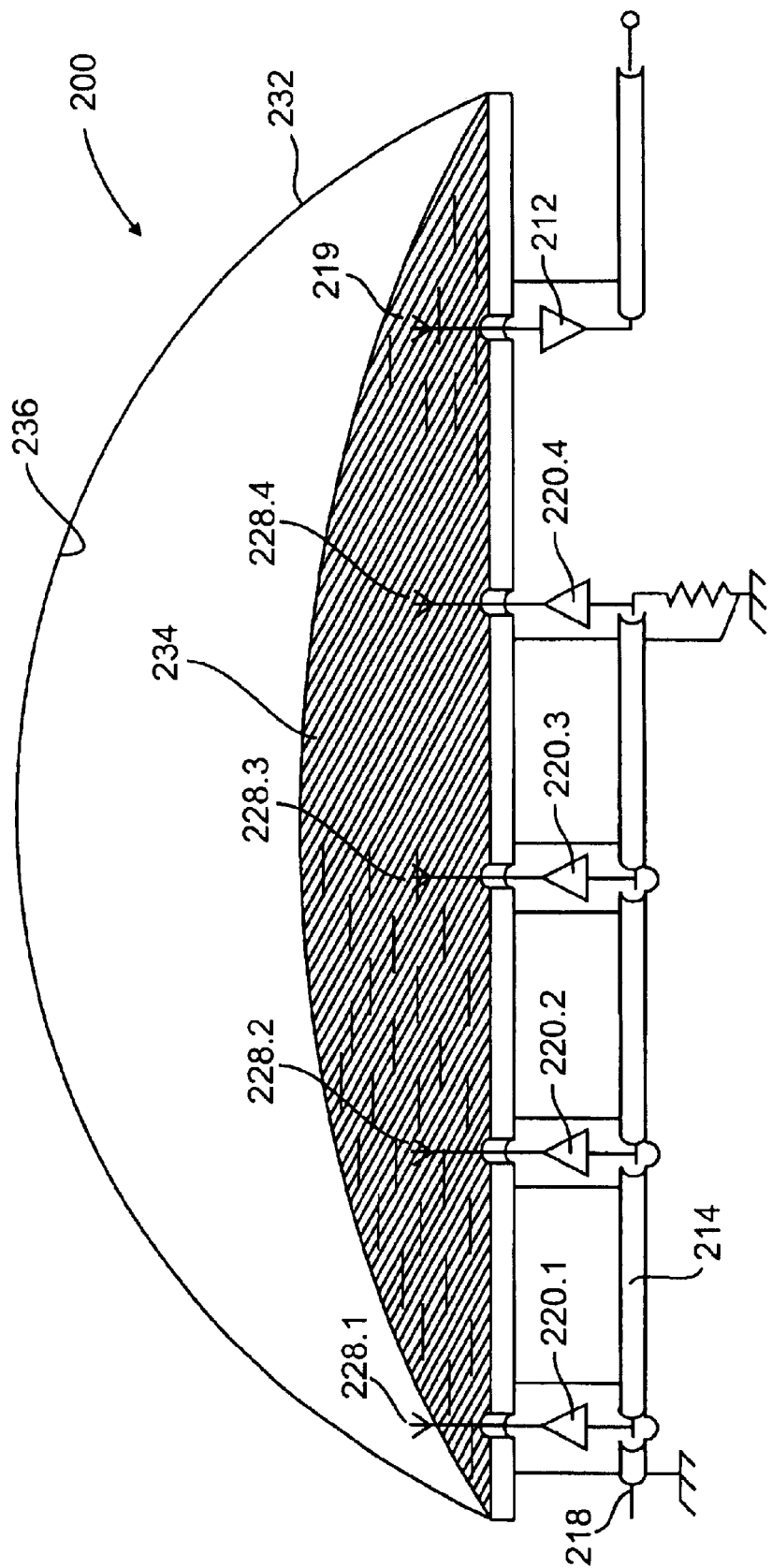
FIG. 4 is a diagrammatic representation of a further embodiment of the arrangement wherein the outputs of amplifier stages are fed into a three-dimensional cavity.

In FIG. 4, there is shown yet a further embodiment of the arrangement according to the invention designated 200. The arrangement 200 comprises a first transmission medium in the form of a coaxial cable 214 providing an input at 218. Amplifiers 220.1 to 220.4 are connected in parallel paths 222.1 to 222.4 and are connected to antennas 228.1 to 228.4 located in a three-dimensional cavity 230 defined by an endosure 232. The endosure 232 comprises a conductive floor 234 and the dome-shaped sidewalls are cladded with absorbent material. Output 219 is connected to output amplifier 212. It is believed that this configuration also provides improved noise suppression characteristics.

Thus, it is hence envisaged that arrangements having two-dimensional (surface technology) or three-dimensional (volume technology) input arrangements and/or two-dimensional or three-dimensional output arrangements also fall within the scope of the invention.

It will be appreciated that there are many variations in detail on the amplifier arrangement and method according to the invention without departing from the scope and spirit of the appended claims.

What is claimed is:

1. A noise suppressing broadband pulse amplifier arrangement comprising:
    (a) a first signal transmission medium extending between a first end thereof providing an input for the amplifier arrangement and a second end thereof, the medium having a constant impedance along the length thereof;
    (b) a second signal transmission medium extending between a first end thereof, and a second end thereof and which end provides an output for the arrangement, the second medium having a constant impedance along the length thereof;
    (c) a plurality of amplifiers connected in respective branches extending between respective spaced positions on the first medium and respective spaced positions on the second medium to provide a plurality of signal paths for an input signal between the input and the output of the arrangement and wherein all the paths have the same signal propagation delay time;
    (d) non-resonant coupling between the branches and the first medium and the second medium; and
    (e) a termination element at the first end of the second medium and a termination element at the second end of the first medium;
    so that at said spaced positions on the second medium amplified signals in the branches are coherently added and caused to propagate towards the output, incoherent noise generated by the amplifiers is incoherently added and divided into noise propagating towards the termination element of the second medium and noise propagating towards the output and so that the noise propagating towards said termination element is dissipated, thereby to amplify the input signal and to suppress the noise.

2. An amplifier arrangement as claimed in claim 1 wherein the spacing between adjacent spaced positions is constant.

3. An amplifier arrangement as claimed in claim 1 wherein one of the first transmission medium and the second transmission medium comprises a transmission line.

4. An amplifier arrangement as claimed in claim 3 wherein each of the first transmission medium and the second transmission medium comprises a coaxial cable.

5. An amplifier arrangement as claimed in claim 3 wherein each of the first transmission medium and the second transmission medium comprises a strip line.

6. An amplifier arrangement as claimed in claim 3 wherein the first transmission medium comprises a transmission line and the second transmission medium comprises a two dimensional conductive layer.

7. An amplifier arrangement as claimed in claim 3 wherein the first transmission medium comprises a transmission line and the second transmission medium comprises a three-dimensional cavity comprising signal absorbent means.

8. A method of amplifying an input signal utilizing an amplifier arrangement and suppressing noise generated by the amplifier arrangement, the method comprising the steps of:

(a) causing the signal to be fed to the amplifier arrangement via an input for the signal at a first end of a first signal transmission medium of the arrangement, the medium extending between the first end and a second end thereof, the medium having a constant impedance along the length thereof;

(b) utilizing a second signal transmission medium of the arrangement which extends between a first end thereof and a second end thereof to provide an output for the signal from the arrangement at the second end thereof, the second medium having a constant impedance along the length thereof;

(c) utilizing non-resonant coupling to feed the input signal to a plurality of amplifiers in respective branches extending between respective spaced positions on the first medium and respective spaced positions on the second medium, thereby to provide a plurality of signal paths for the input signal between the input and the output of the arrangement and wherein all the paths have the same signal propagation delay time;

(d) providing a termination element at the first end of the second medium;

(e) causing at said spaced positions on the second medium amplified signals in the branches coherently to be added and to propagate towards the output, and incoherent noise generated by the amplifiers incoherently to be added and to be divided into noise propagating towards the termination element and noise propagating towards the output; and (f) causing the noise propagating towards the termination element to be dissipated, thereby to amplify the input signal and to suppress the noise generated by the amplifier arrangement.

9. An amplifier arrangement as claimed in claim 1 for a pulse having a full width half maximum (FWHM) parameter and wherein the spacing between adjacent positions is at least equal to a distance through which the pulse would travel in a time corresponding to said FWHM parameter.

* * * * *